United States Patent
Fukuyama et al.

(10) Patent No.: US 7,338,555 B2
(45) Date of Patent: Mar. 4, 2008

(54) HIGHLY CRYSTALLINE ALUMINUM NITRIDE MULTI-LAYERED SUBSTRATE AND PRODUCTION PROCESS THEREOF

(75) Inventors: Hiroyuki Fukuyama, Yokohama (JP); Wataru Nakao, Kawasaki (JP); Shinya Kusunoki, Kawasaki (JP); Kazuya Takada, Shunan (JP); Akira Hakomori, Shunan (JP)

(73) Assignees: Tokuyama Corporation, Tojuyama-shi (JP); The Circle for the Promotion of Science and Engineering, Tokyo (JP)

( * ) Notice: Subject to any disclaimer, the term of this patent is extended or adjusted under 35 U.S.C. 154(b) by 0 days.

(21) Appl. No.: 10/937,344

(22) Filed: Sep. 10, 2004

(65) Prior Publication Data
US 2005/0059257 A1  Mar. 17, 2005

(30) Foreign Application Priority Data
Sep. 12, 2003 (JP) .............................. 2003-320836

(51) Int. Cl.
C30B 25/00 (2006.01)

(52) U.S. Cl. ........................................ 117/84; 117/952
(58) Field of Classification Search ................ 117/84, 117/952
See application file for complete search history.

(56) References Cited

U.S. PATENT DOCUMENTS

| | | | |
|---|---|---|---|
| 4,857,246 A | * | 8/1989 | Bolt .......................... 264/29.2 |
| 4,917,877 A | * | 4/1990 | Oguni et al. ................. 423/412 |
| 4,992,253 A | * | 2/1991 | Wu et al. .................... 423/412 |
| 5,741,724 A | | 4/1998 | Ramdani et al. |
| 6,744,076 B2 | * | 6/2004 | Fukuyama et al. .......... 257/103 |
| 2004/0185666 A1 | * | 9/2004 | Fukuyama et al. .......... 438/689 |

FOREIGN PATENT DOCUMENTS

| | | | |
|---|---|---|---|
| EP | 999640 A2 | * | 5/2000 |
| JP | 2-141495 A | | 5/1990 |
| JP | 2-153897 A | | 6/1990 |

\* cited by examiner

*Primary Examiner*—Yogendra N. Gupta
*Assistant Examiner*—Matthew J. Song
(74) *Attorney, Agent, or Firm*—Birch, Stewart, Kolasch & Birch, LLP

(57) ABSTRACT

A highly crystalline aluminum nitride multi-layered substrate comprising a single-crystal α-alumina substrate, an aluminum oxynitride layer and a highly crystalline aluminum nitride film as the outermost layer which are formed in the mentioned order, wherein the aluminum oxynitride layer has a threading dislocation density of $6.3 \times 10^7 / cm^2$ or less and a crystal orientation expressed by the half-value width of its rocking curve of 4,320 arcsec or less; and a production process thereof.

3 Claims, 11 Drawing Sheets

HIGHLY CRYSTALLINE ALUMINUM NITRIDE MULTI-LAYERED SUBSTRATE AND PRODUCTION PROCESS THEREOF

This Non-provisional application claims priority under 35 U.S.C. § 119(a) on Patent Application No(s). 2003-320836 filed in Japan on Sep. 12, 2003, the entire contents of which are hereby incorporated by reference.

FIELD OF THE INVENTION

The present invention relates to a highly crystalline aluminum nitride multi-layered substrate comprising a highly crystalline aluminum nitride (AlN) film as the outermost layer and a production process thereof.

DESCRIPTION OF THE PRIOR ART

A group III nitride semiconductor typified by gallium nitride (GaN) is attracting much attention as a light emitting device such as a light emitting diode (LED) or laser which emits blue to ultraviolet light. A group III nitride having a high melting point must be epitaxially grown on a substrate such as a sapphire substrate as seen in the multi-layered structure of a blue LED. However, as its lattice mismatch with a substrate material is large, it is still extremely difficult to obtain a group III nitride thin film having few defects. Since the light emission efficiency of a group III nitride-based semiconductor device is determined largely by initial crystal growth on a substrate, the development of a substrate material which has a close lattice match with the group III nitride is the most important to bring about a great breakthrough in this field.

In order to reduce a lattice mismatch between the sapphire of the substrate and the group III nitride, it is proposed that a so-called buffer layer of AlN should be interposed between the sapphire substrate and the group III nitride film. However, as the buffer layer of AlN itself has a large lattice mismatch with the sapphire substrate, it is difficult to obtain a homogeneous thin film having no defect.

To form a buffer layer on the sapphire substrate, molecular beam epitaxy (MBE), halide chemical vapor deposition using aluminum chloride and ammonia, or metal organics vapor phase epitaxy (MOVPE) using trimethyl ammonium and ammonia has been employed. In all of these methods, great distortion remains at the bonding boundary due to a large lattice mismatch between the sapphire of the substrate and the AlN thin film. Therefore, the AlN film formed on sapphire has a columnar aggregate structure like ice columns with a high dislocation density. Accordingly, the conventional AlN film does not fully serve as a buffer layer for growing a GaN film, and threading dislocations are existent in the GaN film from the substrate to the surface of the film at a density of $10^8/cm^2$ or more. This is the cause of reducing the light emission efficiency of a light emitting device.

U.S. Pat. No. 5,741,724 proposes a technology making use of aluminum oxynitride as a buffer layer to relax a lattice mismatch when GaN is formed on an $MgAl_2O_4$ spinel substrate. However, in this prior art, metal organics vapor phase epitaxy or molecular beam epitaxy is used to form an aluminum oxynitride layer, and a GaN film is formed on the aluminum oxynitride layer. Therefore, it cannot be said that the lattice mismatch is fully improved.

JP-A 2-141495 and JP-A 2-153897 (the term "JP-A" as used herein means an "unexamined published Japanese patent application") propose a technology for a multi-layered single-crystal substrate fabricated by forming an aluminum oxynitride film on a sapphire substrate and an aluminum nitride single-crystal thin film on the film. In this technology, the aluminum oxynitride film and aluminum nitride thin film are grown on the sapphire substrate by CVD, and the formed aluminum oxynitride film is composed of a non-equilibrium phase called "distorted super lattice" having an oxygen concentration of 25 mol % on the sapphire substrate side and an oxygen concentration of 0 mol % on the aluminum nitride side and manufactured at a substrate temperature of 1,150° C. This substance differs from cubic inverse-spinnel γ-phase aluminum oxynitride which is existent at 1,630° C. or higher obtained in the present invention.

The inventors of the present invention conducted thermodynamic studies on a reaction for forming aluminum nitride from alumina, carbon and nitrogen as reaction raw materials and found that a highly crystalline aluminum nitride film can be formed not by depositing a thin film of interest on a sapphire substrate but by nitriding the surface of a sapphire substrate to convert an alumina component into aluminum oxynitride and aluminum nitride making use of this equilibrium reaction (see. U.S. Pat. No. 6,744,076).

SUMMARY OF THE INVENTION

The inventors of the present invention continued intensive studies on the conversion of an alumina (to be referred to as "$Al_2O_3$" hereinafter) component into aluminum oxynitride (to be also referred to as "alon" hereinafter) and aluminum nitride (to be also referred to as "AlN" hereinafter) making use of the above equilibrium reaction and discovered that the equilibrium partial pressure of $Al_2O(g)$ which is a decomposed gas becomes extremely high according to a reaction temperature and the partial pressure of carbon monoxide to decompose the unreacted alumina component and the formed AlN.

They discovered that the surface smoothness of the substrate is deteriorated by this decomposition reaction and that the alumina component is converted from the pit toward the interior after decomposition to cause distortion in the crystal growth directions of the formed aluminum oxynitride layer and aluminum nitride layer, thereby reducing crystallinity. Then, they found that a highly crystalline aluminum nitride multi-layered substrate comprising an aluminum oxynitride layer having excellent crystallinity and a low dislocation density and multi-layer defect density can be fabricated by controlling reaction conditions while the surface smoothness of the substrate is retained. The present invention has been thus accomplished based on this finding.

It is an object of the present invention to provide a highly crystalline aluminum nitride multi-layered substrate comprising a single-crystal α-alumina substrate, an aluminum oxynitride layer and a highly crystalline aluminum nitride film as the outermost layer formed in the mentioned order, wherein the aluminum oxynitride layer has a threading dislocation density of $6.3 \times 10^7/cm^2$ or less and a crystal orientation expressed by the half-value width of its rocking curve of 4,320 arcsec or less.

It is another object of the present invention to provide a highly crystalline aluminum nitride multi-layered substrate comprising a highly crystalline aluminum nitride film as the outermost layer which has a surface smoothness in terms of Ra and RMS of 100 nm or less, a threading dislocation density of $6.3 \times 10^7/cm^2$ or less and a crystal orientation expressed by the half-value width of its rocking curve of 600 arcsec or less.

It is still another object of the present invention to provide a process for producing a highly crystalline aluminum nitride multi-layered substrate by nitriding a single-crystal α-alumina substrate in the presence of carbon, nitrogen and carbon monoxide to form an aluminum oxynitride layer and a highly crystalline aluminum nitride film on the aluminum oxynitride layer, wherein nitriding is carried out under reaction conditions which satisfy the following conditions a to d:

a: the equilibrium partial pressure of $Al_2O(g)$ in the reaction formula (1) is $5\times10^{-4}$ bar or less:

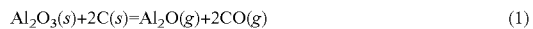

$$Al_2O_3(s)+2C(s)=Al_2O(g)+2CO(g) \tag{1}$$

b: the equilibrium partial pressure of $Al_2O(g)$ in the reaction formula (2) is $5\times10^{-6}$ bar or less:

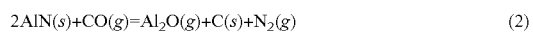

$$2AlN(s)+CO(g)=Al_2O(g)+C(s)+N_2(g) \tag{2}$$

c: the reaction formula (3) proceeds to the right side:

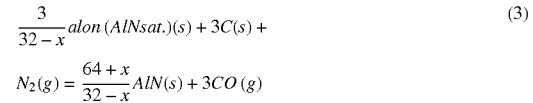

$$\frac{3}{32-x}alon(AlNsat.)(s)+3C(s)+N_2(g)=\frac{64+x}{32-x}AlN(s)+3CO(g) \tag{3}$$

wherein alon (AlNsat.) means aluminum oxynitride which is saturated aluminum nitride, and d: the reaction temperature is 1,630° C. (1903 K) or higher and lower than 1,700° C. (1973 K).

In the present invention, by nitriding the surface of a single-crystal α-alumina substrate, for example, a sapphire substrate, an alon layer is formed on the surface and a highly crystalline AlN film is formed on this alon layer as the under layer as described above. Therefore, the obtained alon layer has an extremely low dislocation density and multi-layer defect density and excellent crystallinity and the AlN film also has a low dislocation density and excellent crystallinity.

Therefore, when this highly crystalline AlN film is used as a light emitting device, an ultraviolet light emitting device having extremely high light emission efficiency can be obtained, and it can be used in a high-density optical memory and also other various fields as an ultraviolet light receiving device. Further, when a group III nitride semiconductor typified by GaN is epitaxially grown on this highly crystalline AlN film, a highly crystalline group III nitride semiconductor film having extremely high crystallinity and few defects can be formed. Therefore, the light emission efficiency of a blue light emitting device or ultraviolet light emitting device comprising this highly crystalline group III nitride semiconductor film can be significantly improved. Further, the highly crystalline AlN film can also be used as a surface acoustic wave device and the drive efficiency of a surface acoustic wave device comprising the film can be improved.

DETAILED DESCRIPTION OF THE PREFERRED EMBODIMENT

The present invention will be described in detail hereinunder.

The present invention is characterized in that an alon layer and an AlN film are formed by directly nitriding a single-crystal α-alumina substrate, for example, a sapphire substrate. The expression "directly nitriding" means that single-crystal α-alumina is nitrided based on the following reaction formula by heating carbon, nitrogen and carbon monoxide as a reaction raw material.

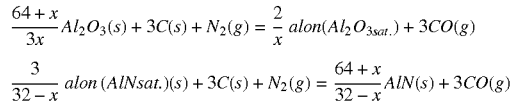

$$\frac{64+x}{3x}Al_2O_3(s)+3C(s)+N_2(g)=\frac{2}{x}alon(Al_2O_{3sat.})+3CO(g)$$

$$\frac{3}{32-x}alon(AlNsat.)(s)+3C(s)+N_2(g)=\frac{64+x}{32-x}AlN(s)+3CO(g)$$

In the above reaction formula, alon ($Al_2O_3$sat.) means alon which is saturated $Al_2O_3$. alon is represented by $(Al_{(64+x)/3}\square_{(8-x)/3}O_{32-x}N_x$ in which $\square$ means a cation hole and $2<x<6$).

A description is subsequently given of the formation of an alon layer and an AlN film on a sapphire substrate.

Figure 1:
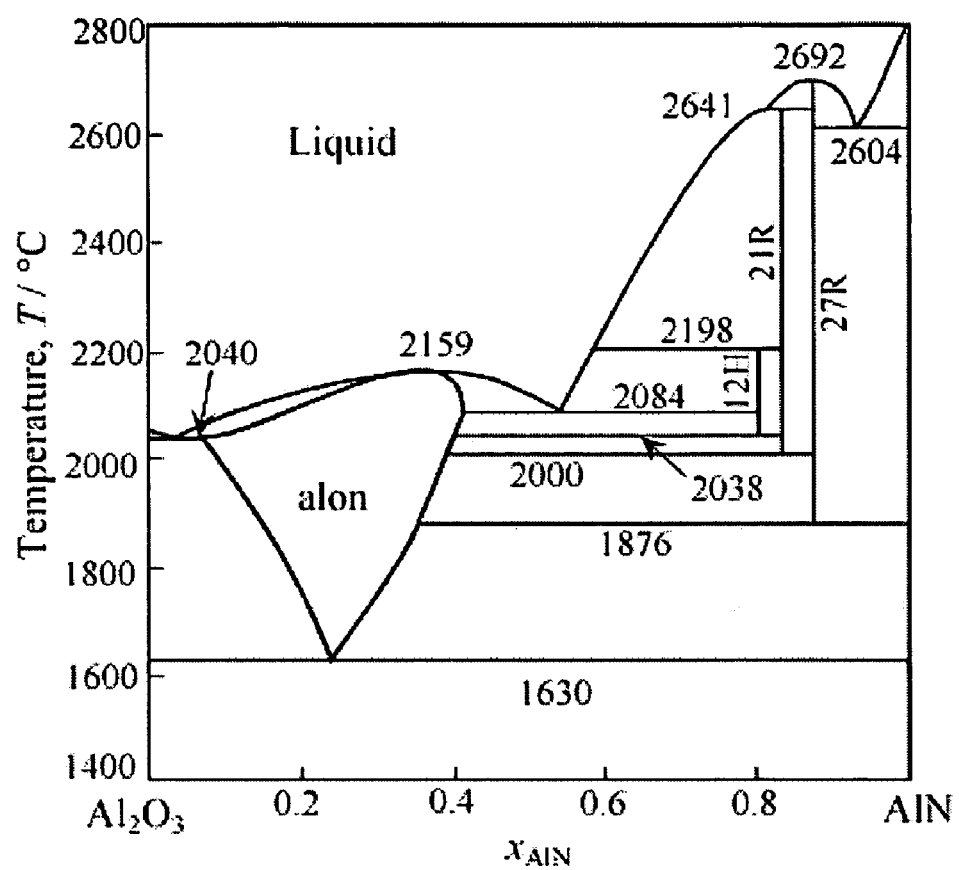
FIG. 1 is an $Al_2O_3$—AlN pseudo binary diagram.

FIG. 1 is an $Al_2O_3$—AlN pseudo binary diagram. As shown in this diagram, alon is existent stably only at a temperature of 1,630° C. (1,903 K) or higher and has a wide solid solution area. This alon layer is attracting attention as a refractory material having high chemical stability at a high temperature and high corrosion resistance in metal refining and characterized in that it has high translucency in the ultraviolet to infrared ranges and is chemically stable even though it is polycrystal.

In the present invention, this alon layer is formed by directly nitriding the surface of a single-crystal α-alumina substrate, for example, a sapphire substrate. That is, the sapphire substrate whose crystal plane on the surface is the (11-20) plane, face A, and graphite are inserted into the homogeneous temperature region of the alumina reaction tube of the apparatus shown in FIG. 2 and the composition of a $N_2$—CO mixed gas is adjusted to nitride the substrate in an atmosphere where oxygen potential and nitrogen potential are controlled.

Figure 3:
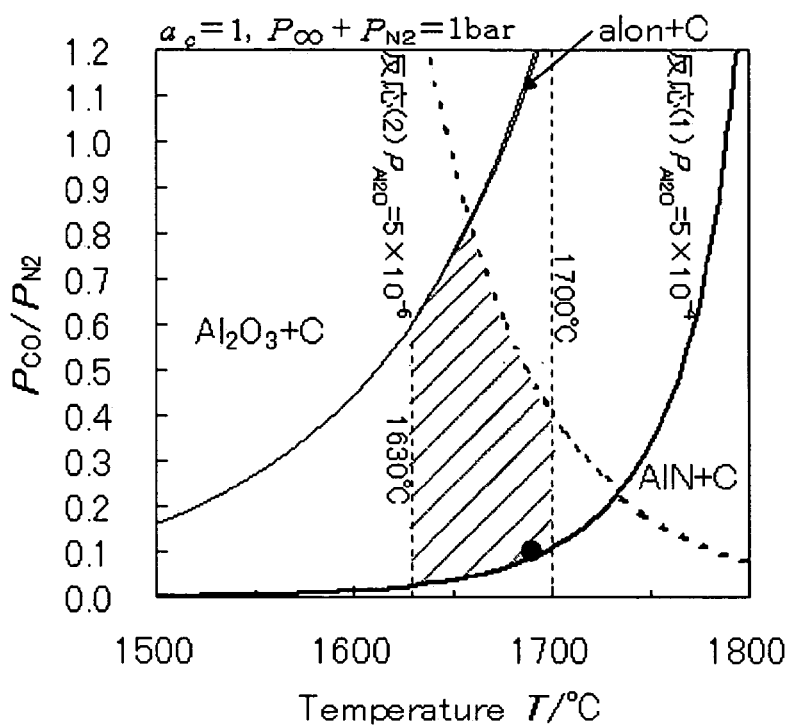
FIG. 3 is an aluminum-oxygen-nitrogen-carbon chemical potential diagram in which temperature (° C.) is plotted on the horizontal axis and the ratio of the partial pressure of CO ($P_{CO}$) and the partial pressure of $N_2$ ($P_{N2}$) is plotted on the vertical axis, and the solid line shows $P_{CO}/P_{N2}$ in the binary diagram of FIG. 1.

In the present invention, it is extremely important that nitriding (reaction) should be carried out in the reaction area shown by the slanting lines of the aluminum-oxygen-nitrogen-carbon chemical potential diagram shown in FIG. 3.

The boundaries of the area shown by the slanting lines can be expressed by reaction temperature, the boundary where direct equilibrium between alon and AlN is attained and the equilibrium partial pressure curve of $Al_2O(g)$ as follows.

The boundary on the lower side of the area shown by the slanting lines is an equilibrium partial pressure curve showing conditions under which the equilibrium partial pressure of $Al_2O(g)$ in the following reaction expression (1) becomes $5\times10^{-4}$ bar.

$$Al_2O_3(s)+2C(s)=Al_2O(g)+2CO(g) \quad (1)$$

The boundary on the upper right side of the area shown by the slanting lines is an equilibrium partial pressure curve showing conditions under which the equilibrium partial pressure of $Al_2O(g)$ in the following reaction formula (2) becomes $5\times10^{-6}$ bar.

$$2AlN(s)+CO(g)=Al_2O(g)+C(s)+N_2(g) \quad (2)$$

The boundary on the right side of the area shown by the slanting lines is a line specified by a reaction temperature of 1,700° C.

The boundary on the upper left side of the area shown by the slanting lines is a boundary where direct equilibrium between alon and AlN is attained and on the lower right side of the boundary, the reaction formula (3) proceeds to the right side.

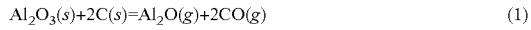

$$\frac{3}{32-x}alon\,(AlNsat.)(s) + 3C(s) + \quad (3)$$

$$N_2(g) = \frac{64+x}{32-x}AlN(s) + 3CO(g)$$

The boundary on the left side of the area shown by the slanting lines is a line specified by a reaction temperature of 1,630° C.

In the present invention, it is important that the nitriding reaction should be carried out by selecting conditions within the range surrounded by the above boundaries.

FIG. 3 shows temperature (° C.) on the horizontal axis and the ratio of CO partial pressure ($P_{CO}$) to $N_2$ partial pressure ($P_{N2}$) as the vertical axis to re-draw the binary diagram of FIG. 1 according to the ratio. The solid lines in the figure show $Al_2O_3$, alon and AlN phase stable areas under the conditions that the total pressure of $P_{CO}$ and $P_{N2}$ is 1 bar and the activity ac of carbon is 1. In the figure, the area where $P_{CO}/P_{N2}$ is high and the temperature is low is an $Al_2O_3$ stable area and the area where $P_{CO}/P_{N2}$ is low and the temperature is high is an AlN stable area. At 1,630° C. or higher, an alon stable area is existent at the boundary between them.

The solid bold line in FIG. 3 is an equilibrium partial pressure curve drawn by connecting conditions under which the equilibrium partial pressure of $Al_2O(g)$ in the above reaction formula (1) becomes $5\times10^{-4}$ bar. The bold broken line is an equilibrium partial pressure curve drawn by connecting conditions under which the equilibrium partial pressure of $Al_2O(g)$ in the above reaction formula (2) becomes $5\times10^{-6}$ bar.

When the nitriding reaction proceeds under reaction conditions under which the equilibrium partial pressure of $Al_2O(g)$ in the above reaction formula (1) is larger than $5\times10^{-4}$ bar, the decomposition speed of $Al_2O(g)$ on the surface of an $Al_2O_3$ substrate becomes high and the sites to be substituted and fixed by nitrogen atoms disappear, thereby deteriorating the surface smoothness of the substrate and reducing the formation efficiencies of AlN and alon at the same time.

When the nitriding reaction proceeds under reaction conditions under which the equilibrium partial pressure of $Al_2O(g)$ in the above reaction formula (2) is higher than $5\times10^{-6}$ bar, the drive force of re-oxidating the formed AlN becomes very large, thereby exerting a bad influence upon the formation speeds of AlN and alon.

Under reaction conditions under which the above reaction formula (3) does not proceed to the right side, that is, proceeds to the left side, AlN is not formed at all.

The nitriding reaction temperature must be 1,630° C. or higher and lower than 1,700° C. At a temperature lower than 1,630° C., alon is not formed and thereby, the defect density cannot be reduced and at 1,700° C. or higher, pores are formed between the alon layer and the AlN film, whereby the formed film tends to peel off.

In the present invention, a high-quality AlN film which will be described hereinafter is formed as the outermost layer on the substrate and a high-quality alon layer which will be described hereinafter is formed between the substrate and the AlN film by promoting the reaction on the substrate in the above reaction condition area shown by the slanting lines out of reaction conditions shown by the AlN stable area shown in FIG. 3.

The XRD (X-ray diffraction) profile of FIG. 4 which will be described hereinafter is obtained when alon and AlN are grown at a temperature and a partial pressure ratio of CO to $N_2$ shown by the symbol ● in FIG. 3.

The reaction conditions under which the equilibrium partial pressure of $Al_2O(g)$ in the above reaction formula (1) becomes $5\times10^{-4}$ bar are obtained by using the expression (4) for calculating Gibbs energy change $\Delta_{r(1)}G$ in the reaction formula (1).

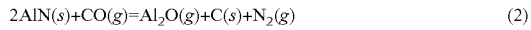

$$\Delta_{r(1)}G = \Delta r_{(1)}G° + RT\,\ln\frac{P_{Al_2O}\cdot P_{co}^2}{a_{AL_2O_3}\cdot a_c^2} \quad (4)$$

$$= \Delta_f G°_{Al_2O} + 2\Delta_f G°_{CO} - \Delta_f G°_{Al_2O_3} -$$

$$2\Delta_f G°_C + RT\,\ln\frac{P_{Al_2O}\cdot P_{co}^2}{a_{Al_2O_3}\cdot a_c^2}$$

In the above expression, R is a gas constant, and T is an absolute temperature ai and Pi are the activities of component i with respect to pure $Al_2O_3$, pure AlN, pure graphite, alon saturated with AlN and 1 bar as standard states.

The approximation expression of standard Gibbs energy change $\Delta_{r(1)}G°$ in the reaction formula (1) at a range of 1,700K to 2,300 K is first obtained from standard formed Gibbs energy $\Delta_f G°\,Al_2O$, $\Delta_f° CO$, $\Delta_f° Al_2O_3$ and $\Delta_f° C$. at the temperature T of $Al_2O_3(s).(s).Al_2O(g).CO(g)$ described in NIST-JANAF Thermochemical Tables by the method of least square and determined as the following expression.

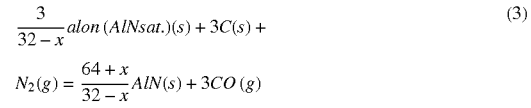

$$\Delta_{r(1)}G°=1245-0.5291T(kJ) \quad (5)$$

This approximation expression (5) and $\Delta_{r(1)}G=0$, $PAl_2O=5\times 10^{-4}$, $aAl_2O_3=1$ and $ac=1$ are inserted into the expression (4) to obtain the functions of the temperature T and $p_{CO}$.

$$P_{CO} = \sqrt{2 \times 10^3 \cdot e^{\left(63.64 - \frac{1.497 \times 10^5}{T}\right)}} \quad (6)$$

In FIG. 3, this $p_{CO}$ is plotted on the vertical axis as $P_{CO}/P_{N2}=P_{CO}/(1-P_{CO})$.

The reaction conditions under which the equilibrium partial pressure of $Al_2O(g)$ in the above reaction formula (2) becomes $5\times10^{-6}$ bar are obtained by using the expression (7) for calculating Gibbs energy change $\Delta_{r(2)}G$ in the reaction formula (2).

$$\Delta_{r(2)}G = \Delta_{r(2)}G^\circ + RT \ln \frac{P_{Al_2O} \cdot P_{n_2} \cdot a_c}{a_{AlN}^2 \cdot P_{CO}} \quad (7)$$

$$= \Delta_f G^\circ_{Al_2O} + \Delta_f G^\circ_C + \Delta_f G^\circ_{N_2} - 2\Delta_f G^\circ_{AlN} -$$

$$\Delta_f G^\circ_{co} + RT \ln \frac{P_{Al_2O} \cdot P_{n_2} \cdot a_c}{a_{AlN}^2 \cdot P_{CO}}$$

The approximation expression of standard Gibbs energy change $\Delta r(2)G^\circ$ in the reaction formula (2) at 1,700 K to 2,300 K is first obtained from $C(s).Al_2O(g).CO(g).N_2(g)$ disclosed in NIST-JANAF Thermochemical Tables and standard formed Gibbs energy $\Delta_f G^\circ$ $Al_2O$, $\Delta_f G^\circ$ CO, $\Delta_f G^\circ$ AlN, $\Delta_f G^\circ$ $N_2$ and $\Delta_f G^\circ$ C. at the temperature T of AlN(s) announced by the inventors in Journal of The American Ceramic Society Vo. 85, No. 4, pp.889-896 by the method of least square and determined as the following expression.

$$\Delta_{r(2)}G^\circ = 553.9 - 0.1868T(kJ) \quad (8)$$

This approximation expression (8) and $\Delta_{r(2)}G=0$, $PAl_2O=5\times 10^{-6}$, $aAlN=1$, $ac=1$ and $P_{N2}=1-P_{CO}$ are inserted into the expression (7) to obtain the functions of the temperature T and $P_{CO}$.

$$P_{CO} = \frac{5 \times 10^{-6}}{5 \times 10^{-6} + e^{\left(22.46 - \frac{6.662 \times 10^4}{T}\right)}} \quad (9)$$

In FIG. 3, this $P_{CO}$ is plotted on the vertical axis as $P_{CO}/P_{N2}=P_{CO}/(1-P_{CO})$.

The boundary conditions of the above reaction formula (3) are obtained by using the expression (11) for calculating standard Gibbs energy change disclosed by the inventors in the thesis for a doctorated titled "The thermodynamic phase stability of the Al—O—N system and the fabrication of single-crystal AlN using γ-alon buffer layer" written by Mr. W. Nakao, Tokyo Institute of Technology, 2003:

$$\Delta_{r(3)}G^\circ = 691.4 - 0.3430T(kJ) \quad (10)$$

and Gibbs energy change $\Delta_{r(3)}G$ in the reaction formula (3).

$$\Delta_{r(3)}G = \Delta_{r(3)}G^\circ + RT \ln \frac{a_{AlN}^{(64+x)/(32-x)} \cdot P_{CO}^3}{a_{alon(AlNsat.)}^{3/(32-x)} \cdot a_C^3 \cdot P_{N_2}} \quad (11)$$

-continued $$= 691.4 - 0.3430T + RT \ln \frac{a_{AlN}^{(64+x)/(32-x)} \cdot P_{CO}^3}{a_{alon(AlNsat.)}^{3/(32-x)} \cdot a_C^3 \cdot P_{N_2}}$$

$\Delta_{r(3)}G=0$, $aAlN=1$, $alon(AlN\ sat.)=1$, $ac=1$, $P_{N2}=1-P_{CO}$ are inserted into the expression (11) to obtain the functions of T and $P_{CO}$.

$$P_{CO}^3 + e^{\left(41.26 - \frac{8.316 \times 10^4}{T}\right)} P_{CO} - e^{\left(41.26 - \frac{8.316 \times 10^4}{T}\right)} = 0 \quad (12)$$

In FIG. 3, $P_{CO}$ is plotted on the vertical axis as $P_{CO}/P_{N2}=P_{CO}/(1-P_{CO})$.

A general nitriding reaction method will be described hereinbelow. It is needless to say from this that the reaction conditions of the present invention must be satisfied. As the heater used in the present invention may be used various furnaces for manufacturing ceramics. However, the heater must be able to expose a sapphire substrate to a high temperature of 1,630° C. to 1,700° C. in a mixed gas of nitrogen and carbon monoxide. It is preferably designed to maintain a temperature difference in the sapphire substrate at ±5° C. or less.

Preferably, an α-alumina substrate, specifically a sapphire substrate used in the present invention has a smooth surface to obtain a high-quality alon layer and highly oriented AlN. Therefore, a general sapphire substrate for epitaxial growth is preferably used. To form an alon layer and an AlN film on the surface of this substrate, any face may be used as the crystal face of the substrate but a face for forming an AlN film which is oriented in the c-axis direction perpendicular to the surface of the substrate, such as the face A, is preferred.

Various commercially available carbon products may be used. The purity of carbon is preferably 99.9% or higher, more preferably 99.999% or higher. The weight ratio of carbon to α-alumina contained in the reaction system is preferably 0.1 or more.

Gaseous nitrogen and gaseous carbon monoxide are generally used but nitrogen having a purity of 99.9999% or higher and carbon monoxide having a purity of 99.9% or higher are preferred.

The total pressure of the reaction system is preferably around 1 bar to facilitate the manufacture and operation of the reactor. Prior to the reaction, after the inside of the reactor is evacuated, a mixed gas having a predetermined partial pressure is introduced into the reactor. During the reaction, this mixed gas is flown at a predetermined rate. Since it is necessary to always have nitrogen atoms reach the surface of the substrate, this mixed gas having a pressure of 1 atm. and a temperature of 25° C. is preferably introduced at a flow rate of 5 mL/min or more based on 1 $cm^2$ of the sectional area of the reactor on the plane perpendicular to the gas flow. More preferably, a preheater for preheating the gas to be introduced before it reaches the sapphire substrate is installed.

The temperature elevation rate can be arbitrarily determined but a temperature elevation rate of 5° C./min or more is preferably employed.

The heating time is suitably determined according to a desired film thickness. For example, the growth rate of the highly crystalline AlN film at 1,690° C. and a $P_{CO}/P_{N2}$ of 0.1 is 0.5 to 0.8 µm for a 48-hour reaction and the growth rate of the alon layer is 0.6 to 1.0 µm for a 48-hour reaction.

As described above, nitriding must be carried out under specific reaction conditions in the present invention. In order to carry out nitriding under the above reaction conditions, it is necessary to precisely control the reaction temperature, the state of a heating furnace material and the partial pressures of carbon monoxide and nitrogen to be introduced all the times.

The reaction temperature is measured at a point as close to the sapphire substrate as possible. The measurement instrument should not allow the entry of impurities into the reaction system. In the present invention, a method for contacting a B thermocouple or W-5% Re/W-26% Re thermocouple protected by a one-end closed pipe made of an α-alumina sintered material to the support tool of a sapphire substrate or a method for measuring infrared radiation emitted from the graphite support tool of a sapphire substrate with a radiation thermometer is suitably employed. Since long-time operation is required according to a desired film thickness, a system capable of PID controlled automated operation is preferably installed.

The heating furnace is preferably made of α-alumina, aluminum oxynitride or AlN used in the present invention. Since the atmosphere to be introduced is reducing, it is desired that oxygen or metal vapor should not be discharged under the reaction conditions of the present invention. In the case of an α-alumina furnace, it is effective to install the heater under the reaction conditions of the present invention to nitride the surface of the heater before use.

Although any commercially available flow meter may be used for the control of the partial pressures of carbon monoxide and nitrogen to be introduced, a system capable of automated operation as well as temperature control is preferably installed.

After the end of the reaction, the reaction tube is quenched, for example, by pulling it from the furnace to be taken out. If the cooling rate is low, the alon layer formed between the substrate and the AlN film may decompose into AlN or α-alumina at a temperature lower than the lower temperature limit (1,630° C.) of the alon stable area. Thereby, after the end of the reaction, the reaction tube is preferably cooled as quickly as possible.

The alon layer and the AlN film can be formed on the substrate continuously in the same step. FIG. 4 is a graph showing the XRD (X-ray diffraction) profile regarding with a grown multi-layered film consisting an alon layer and an AlN film formed on a sapphire substrate using a Cu X-ray tube as an X-ray source as described above. In FIG. 4, the horizontal axis shows the diffraction angle 2θ and the vertical axis shows the intensity of X-radiation. The partial pressure ratio ($P_{CO}/P_{N2}$) of CO to $N_2$ in the mixed gas was 0.1 and the sapphire substrate was heated at 1,690° C. for 48 hours in this atmosphere. As shown in FIG. 4, a laminate consisting of α-alumina (sapphire substrate) which is oriented on the face A, alon which is oriented on the (111) plane and AlN which is oriented on the (0001) plane is formed.

Figure 4:
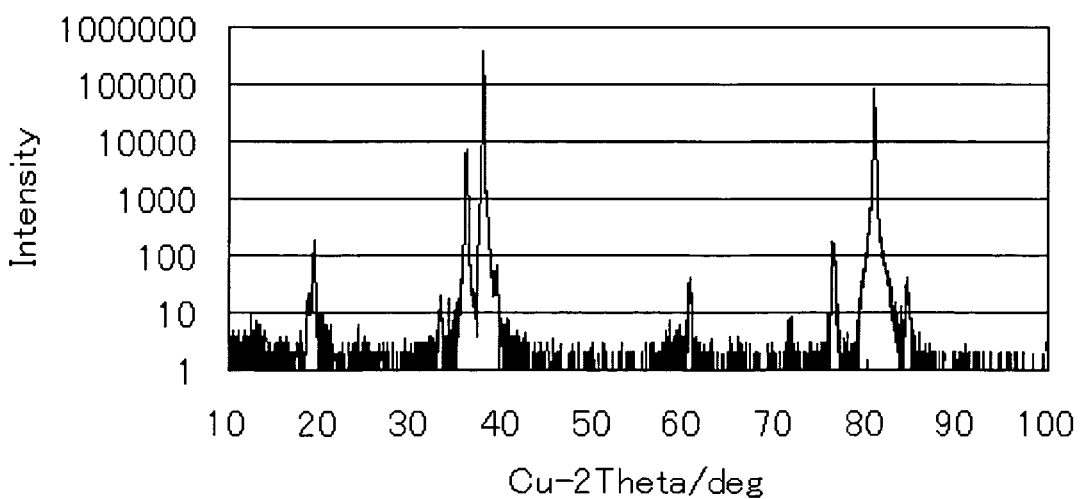
FIG. 4 is a graph showing the XRD (X-ray diffraction) profile of a grown multi-layered film consisting an alon layer and an AlN film formed on a sapphire substrate.

As shown in FIG. 4 and Table 1, it is understood that a sapphire/alon/AlN laminate grows, the formed alon and AlN are oriented on a single crystal plane and the crystal orientation relationship is face-A sapphire//(111)alon//(0001) AlN.

Since no threading dislocation is seen in any crystal phase from a transmission electron microscope (TEM) photo (FIG. 8) of the cross sections of the alon layer and AlN film obtained in the present invention, the dislocation density (the estimated largest value) is calculated as $6.3 \times 10^7/cm^2$ or less based on the assumption that one dislocation is existent in a range given by the product of 8 µm which is the length of the long side of the photo and 0.2 µm which is the thickness of the transmitted sample.

In the crystal orientation expressed by the half-value width of the ω-mode rocking curve of the face-A sapphire, (111)alon and (0002)AlN, that of the alon layer is 4320 arcsec or less and that of the AlN film is 600 arcsec or less. The term "the half-value width of the ω-mode rocking curve" is the range of ω which is 50% or more of the largest diffraction X-ray count value in the diffraction chart obtained by fixing the sum of the incident angle (ω) and reflection angle of X-radiation at an angle at which the sample satisfies Bragg's diffraction condition and changing ω. As this value becomes larger, the crystal direction fluctuates more, that is, crystallinity becomes lower. In the case of a single-crystal, the half-value width is generally 100 arcsec or less. The highly crystalline AlN film is particularly preferably be composed of single-crystals but does not need to be composed of single-crystals. Even if it is composed of oriented polycrystals which show the same behavior as that of the single-crystals and oriented in the same direction though it is an assembly of crystals, the effect of the present invention which will be described hereinafter is obtained.

The surface smoothness was calculated in a 200 µm×200 µm area from information on the height of the surface of the AlN film obtained by a laser microscope based on the definitions of Ra and RMS specified in JIS B0601-1994. The surface smoothness of the highly crystalline AlN film formed on the alon layer is 100 nm or less in terms of Ra and RMS.

As for the highly crystalline AlN substrate in the present invention, the crystal plane of the single-crystal $\alpha$-$Al_2O_3$ substrate is preferably the (11-20) plane, face A, and the crystal plane of the highly crystalline AlN film is the (0001) plane.

The alon layer formed as the under layer of the AlN film of the multi-layered substrate obtained in the present invention has an extremely low threading dislocation density of $6.3 \times 10^7/cm^2$ or less. Further, the AlN film formed on the alon layer also has an extremely low threading dislocation density of $6.3 \times 10^7/cm^2$ or less like the under layer and a high surface smoothness in terms of Ra and RMS of 100 nm or less. As a result, variations in the growth direction of the alon layer and the AlN film are very small and multi-layered films comprising them have excellent crystallinity.

As described above, a multi-layered substrate comprising a highly crystalline AlN film and an alon layer with excellent characteristic properties can become a light emitting device comprising the AlN film as a light emitting film by itself, and a light emitting device comprising a group III nitride film as a light emitting film can be obtained by forming a single-crystal gallium nitride (GaN) film or desired group III nitride mixed crystal film such as AlGaN/InGaN on this AlN film. More specifically, the AlN film itself can be used as an ultraviolet light emitting layer. This AlN ultraviolet light emitting device can be used in a high-density optical memory. The AlN film can also be widely used as an ultraviolet light receiving device.

This group III nitride mixed crystal film can be formed by metal organics vapor phase epitaxy, halide chemical vapor deposition or molecular beam epitaxy. When the AlN film having excellent crystallinity obtained in the present invention is used as an under layer, an n-type group III nitride having excellent crystallinity is formed.

When an AlN film is formed on a sapphire substrate by MBE or MOVPE as in the prior art the lattice mismatch between the sapphire substrate and the AlN film becomes 17%. However, when an AlN film is formed on an alon layer as an under layer after the alon layer is formed by directly nitriding the sapphire substrate, the lattice mismatch at the boundary between the sapphire substrate and the alon layer and the lattice mismatch at the boundary between the alon layer and the AlN film can be reduced to about 5%. Therefore, a highly crystalline AlN film can be formed. Accordingly, when a group III nitride film is formed on this AlN film, a high-quality group III nitride thin film having very few threading dislocations can be formed. Consequently, the light emission efficiency of a light emitting device comprising this group III nitride light emitting layer can be significantly improved.

Since the highly crystalline AlN multi-layered substrate of the present invention has larger anisotropy in surface elasticity than a conventional polycrystal substrate, it can be used as a high-performance surface acoustic wave device. This surface acoustic wave device can be used in portable telephones, mobile communication, TV intermediate band filters, satellite telephones, etc.

EXAMPLES

Example 1

Figure 2:
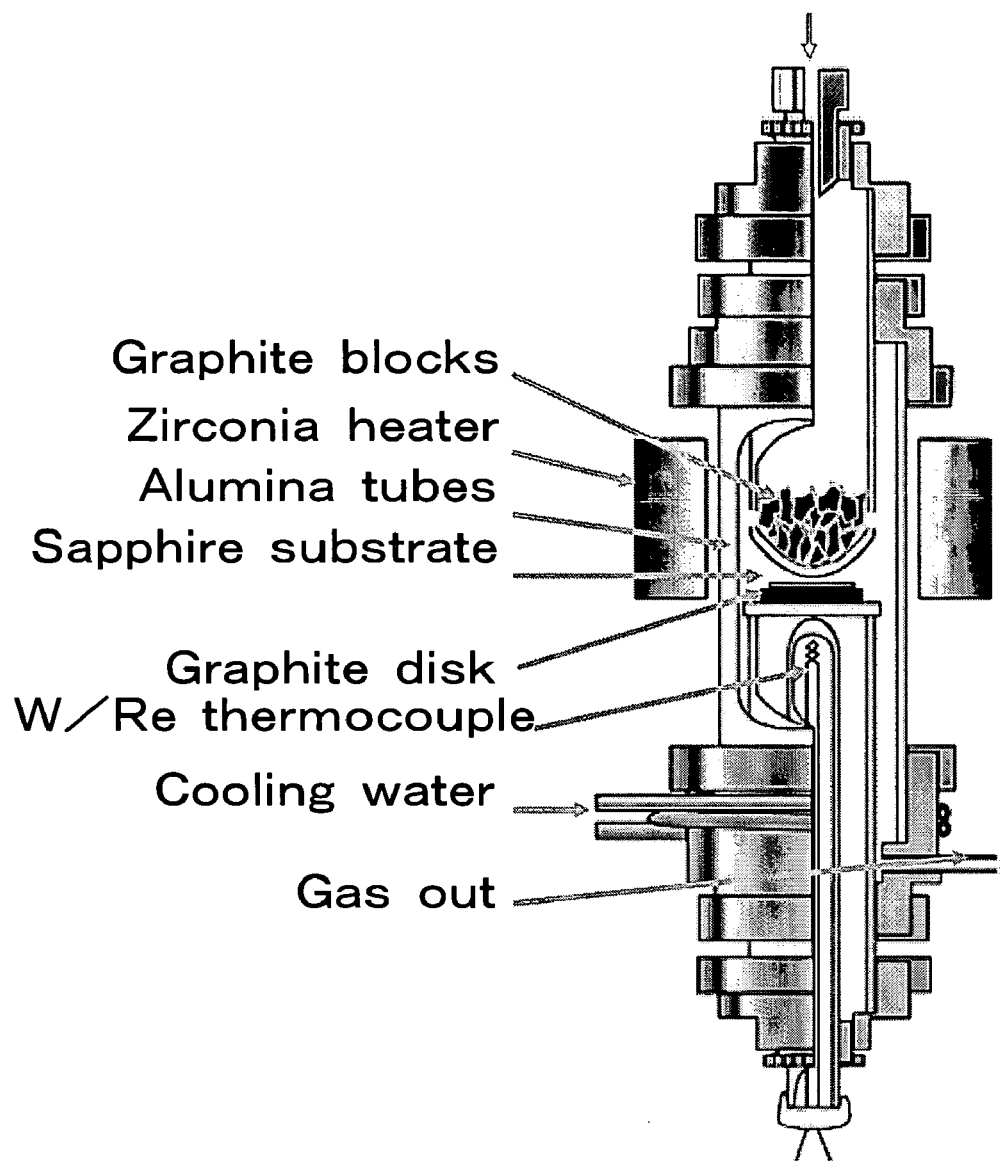
FIG. 2 is a diagram of a reactor used in Examples of the present invention.

An AlN film and an alon layer were formed by nitriding a sapphire substrate with an $N_2$—CO mixed gas and graphite at 1,690° C. in the reactor shown in FIG. 2. An alumina base was installed at the center of an alumina reaction tube, and a graphite disk (purity of 99.999%, 15 mm in diameter×2.5 mm) and a sapphire substrate (12.5 mm in diameter×0.33 mm) whose surface crystal plane was the (11-20) plane, face A, were mounted on the base. The sapphire substrate before a reaction had a surface roughness Ra of less than 1 nm and a half-value width of its rocking curve of 56 arcsec. A one-end closed pipe having four 2 mm-diameter holes in the bottom in a horizontal direction was inserted above the sapphire substrate, 5.0 g of graphite blocks (purity of 99.999%) were filled in the pipe, and a mixed gas to be introduced passed through this graphite layer to reach the sample.

The inside of the reaction tube was evacuated with a rotary pump to completely remove water in the tube and completely substituted by the mixed gas having a partial pressure ratio of carbon monoxide (CO) to nitrogen ($N_2$) of 0.1. Thereafter, this mixed gas was flown into the tube at a predetermined rate (55 ml/min). The total pressure of the reactor was 1 atm. The base mounting the sapphire substrate was inserted into the soaking pit of the furnace to quickly heat the sample and a reaction was started by maintaining the temperature of the sample at 1,690° C. After the sample was kept for 48 hours, the reaction tube was pulled from the furnace to quench the sample and terminate the reaction. The cooling rate was 40° C./min.

The diffraction peaks of the (111) plane of alon and the (0002) plane of AlN were observed by X-ray diffraction analysis in the sapphire substrate obtained after the reaction in addition to the (11-20) plane of the sapphire substrate (FIG. 4). It was found from this that the AlN film and alon layer formed on the entire surface of the sample had a single crystal orientation. That is, the following crystal orientation relationship is established.

Face-A sapphire//(111)alon//(0001)AlN

Table 1 shows the details of XRD (X-ray diffraction) peaks of grown multi-layered film consisting the alon layer and the AlN film on the sapphire substrate.

TABLE 1

| | plane interval | identified substance | crystal plane |
|---|---|---|---|
| Diffraction angle(Cu-K$\alpha_1$) | | | |
| 19.42° | 4.567 Å | alon | (111) |
| 36.03° | 2.491 Å | AlN | (0002) |
| 37.81° | 2.377 Å | $Al_2O_3$ | (11-20) |
| 39.37° | 2.287 Å | alon | (222) |
| 60.63° | 1.526 Å | alon | (333) |
| 76.25° | 1.248 Å | AlN | (004) |
| 80.74° | 1.189 Å | $Al_2O_3$ | (22-40) |
| 84.45° | 1.146 Å | alon | (444) |
| Diffraction angle (Cu-K$\beta_1$) | | | |
| 34.05° | 2.377 Å | $Al_2O_3$ | (11-20) |
| 71.66° | 1.189 Å | $Al_2O_3$ | (22-40) |

Figure 5:
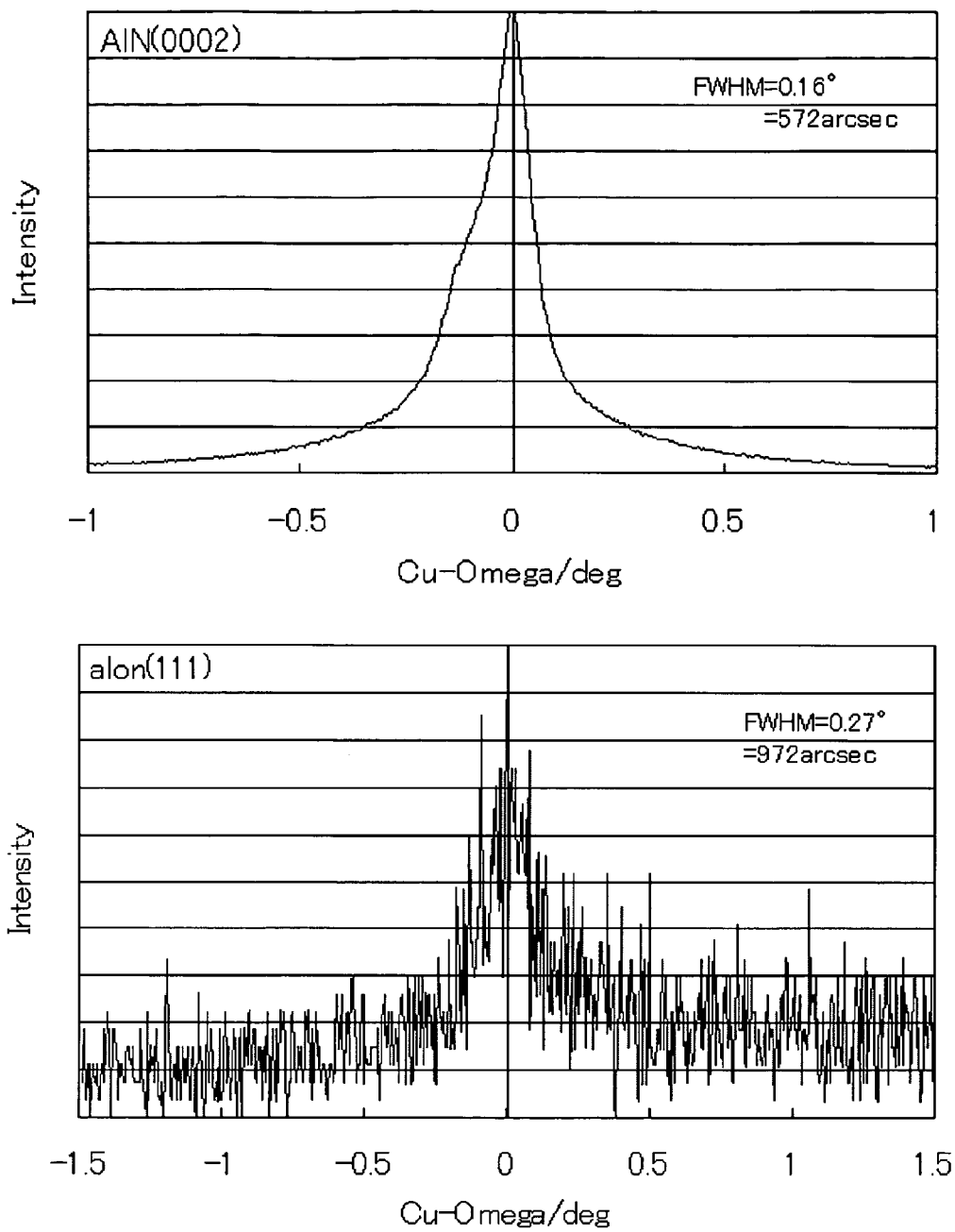
FIG. 5 are graphs showing the ω-mode rocking curves of crystal phases of a grown multi-layered film consisting an alon layer and an AlN film obtained in Example 1.

FIG. 5 shows graphs of ω-mode rocking curves measured for the evaluation of crystallinity of the crystal phases of the substrate obtained after the reaction. It was found from these graphs that as the half-value width of alon layer was 972 arcsec and the half value width of AlN was 576 arcsec, they have high crystallinity, as the half-value width of the sapphire substrate after the reaction was changed to 324 arcsec, which shows that distortion occurred at around the interface.

Figure 6:
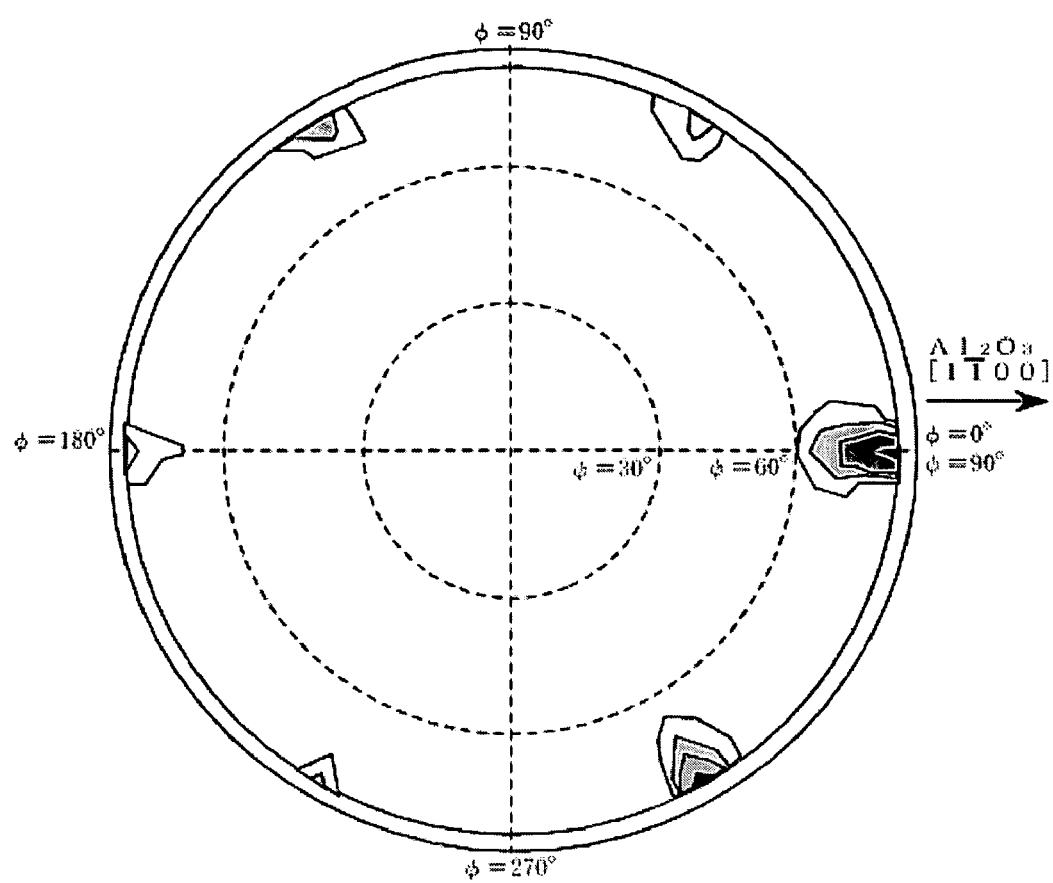
FIG. 6 is a pole figure of {1-100} of an AlN film grown on face-A sapphire.
Figure 7:
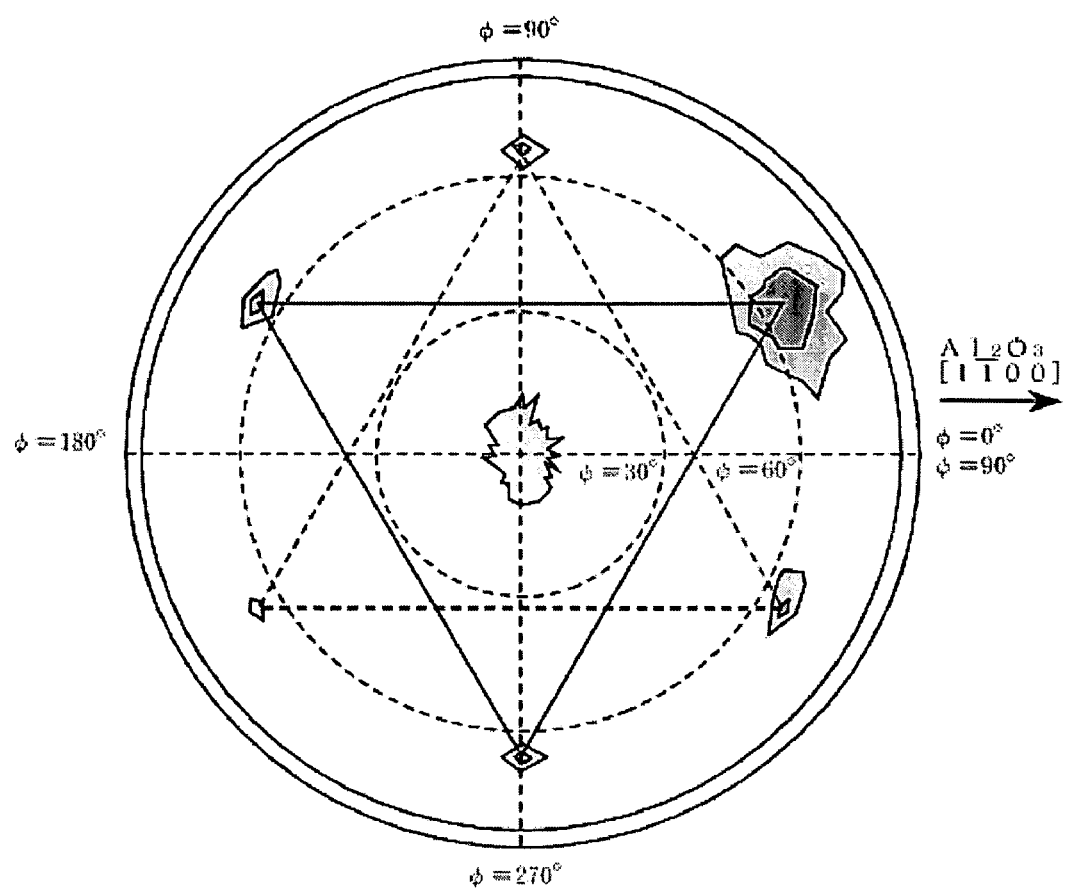
FIG. 7 is a pole figure of {111} of an alon layer grown on face-A sapphire.

FIG. 6 shows the pole figure of the {1-100} plane of the formed AlN film and FIG. 7 shows the pole figure of the {111} plane of the alon layer. φ=0° in the pole figures is the [1-100] direction of sapphire. It is understood from FIG. 6 that the {1-100} plane of AlN has six diffraction peaks at a φ of 90° at φ intervals of 60°. This means that the (0001) plane of AlN is parallel to the face A of the sapphire substrate. Further, the [1-100] direction within the (0001) plane of AlN coincides with the [1-100] direction of sapphire.

It is understood from FIG. 7 that the {111} plane of alon has 6 diffraction peaks at the origin and a φ of 70° at φ intervals of 60°. This means that the (111) plane of alon is parallel to the face A of the sapphire substrate and has two crystal orientations which turn at 180° on the (111) plane of alon and are shown by a solid line and a broken line. The [11-2] direction within the (111) plane of alon is existent at 30° from the [1-100] direction of sapphire. This is because the [1-10] direction within the (111) plane of alon is parallel to the [1-100] direction of sapphire. That is, it was found that the (111) plane of alon has the following crystal orientation relationship as well.

[1-100]AlN//[1-10]alon//[1-100]sapphire

Figure 8:
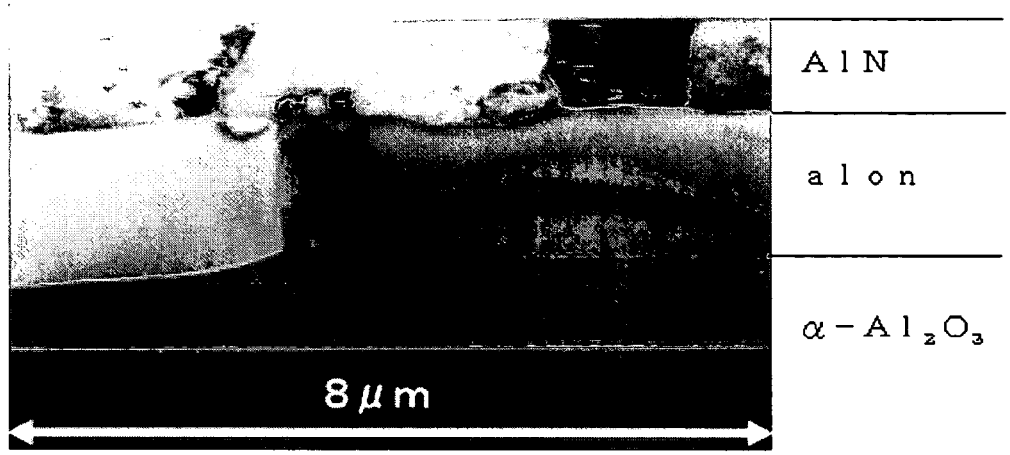
FIG. 8 is a TEM image of the section of a face-A sapphire substrate after a nitriding reaction obtained in Example 1.

FIG. 8 shows a TEM image of the cross sections of the AlN film and alon layer formed on the face-A sapphire substrate obtained in this example. This view field shows transmission information on the substrate area of 8.0 μm×0.2 μm and no threading dislocation can be confirmed in this area. It was found from this that the threading dislocation density in the formed AlN and alon is $6.3 \times 10^7/cm^2$ or less which is much lower than the AlN film formed on the existing sapphire substrate. Further, a lamination defect in the alon layer could not be confirmed.

As for surface roughness, an Ra of 72 nm and an RMS of 97 nm were obtained for the 200 μm×200 μm area from information on the height of the surface of the AlN film on the face-A sapphire substrate obtained in this example.

Example 2

An AlN film and an alon layer were formed by nitriding a sapphire substrate with a $N_2$—CO mixed gas and graphite at 1,660° C. in the reactor shown in FIG. 2. The details of the reactor were the same as in Example 1 and a mixed gas having a partial pressure ratio of carbon monoxide (CO) to nitrogen ($N_2$) of 0.1 was introduced to maintain the inside of the reactor at 1,660° C. for 24 hours.

The crystal orientation relationship between the obtained alon layer and AlN film was completely the same as in Example 1.

Figure 9:
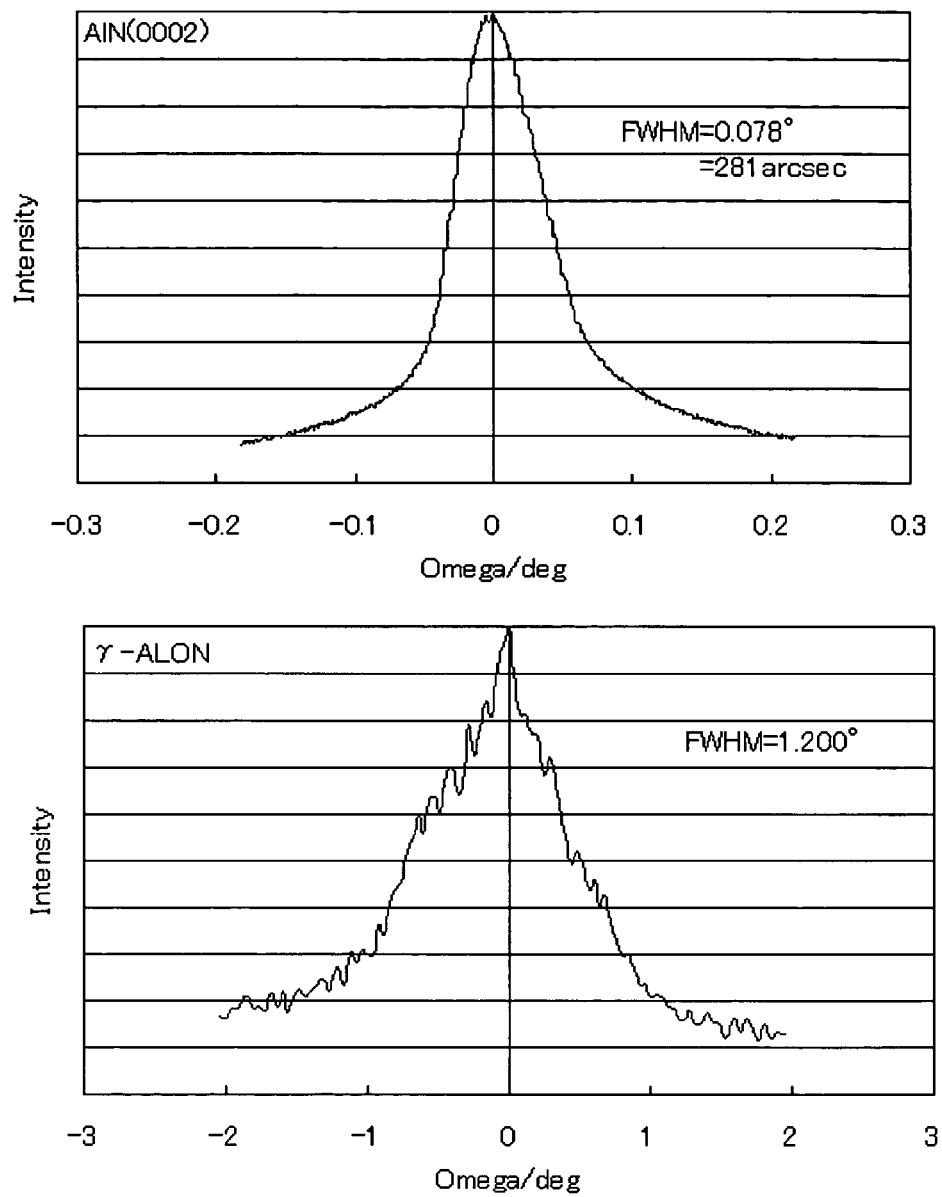
FIG. 9 are graphs showing the ω-mode rocking curves of crystal phases of a grown multi-layered film consisting an alon layer and an AlN film obtained in Example 2.

FIG. 9 shows graphs of ω-mode rocking curves. It is understood from the graphs that as the half-value width of the alon layer was 4,320 arcsec and the half-value width of AlN was 281 arcsec, they have high crystallinity. The half-value width of the sapphire substrate after the reaction was 241 arcsec.

Figure 10:
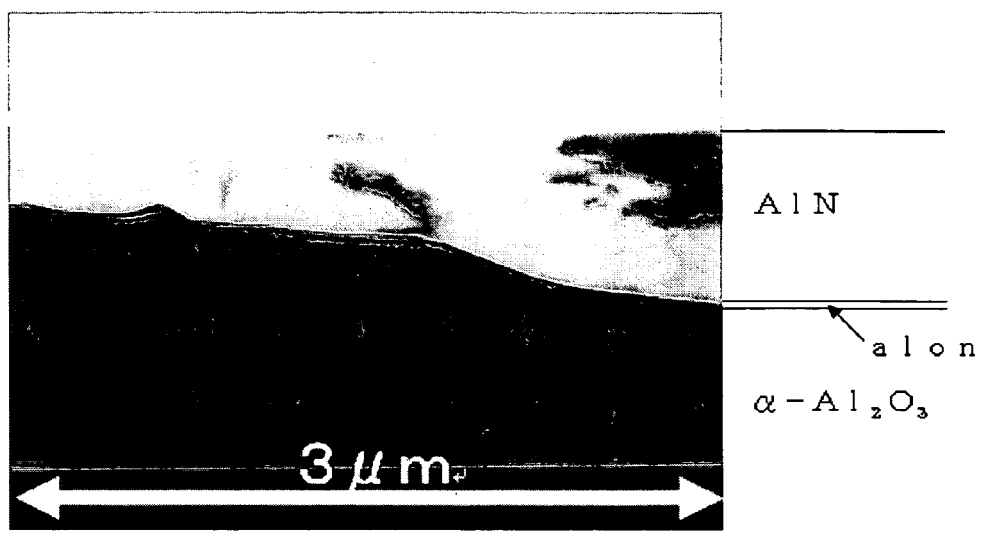
FIG. 10 is a TEM image of the cross section of a face-A sapphire substrate after a nitriding reaction obtained in Example 2.

FIG. 10 is a TEM image of the cross sections of the AlN film and alon layer formed on the face-A sapphire substrate obtained in this example. It is understood from this image and the half-value widths of the rocking curves that the alon layer was formed very thin and greatly distorted by the influence of sapphire and the AlN film below and above the alon layer when the temperature was low and the retention time was short. However, there was no threading dislocation in the AlN film, and the effect of the present invention was obtained.

As described above, according to the present invention, a uniform highly crystalline AlN film having excellent crystallinity and few defects can be formed on a single-crystal α-alumina substrate at a low cost without using a halide-based toxic gas in halide chemical vapor deposition and an organic metal-based toxic gas in MOVPE.

When this highly crystalline AlN film is used as a buffer layer used for the formation of a group III nitride film, the light emission efficiency of a light emitting device such as a blue light emitting diode or a blue laser can be greatly improved and when a highly crystalline AlN film is used as a ultraviolet light emitting diode, the light emission efficiency of an ultraviolet light emitting device and the light receiving efficiency of a light receiving device can be greatly improved. Further, this highly crystalline AlN film can be used in a high-density optical memory and surface acoustic device.

Comparative Example 1

An attempt was made to form an AlN film and an alon layer by nitriding a sapphire substrate with an $N_2$—CO mixed gas and graphite at 1,650° C. in the reactor shown in FIG. 2. The details of the reactor were the same as in Example 1 and a mixed gas having a partial pressure ratio of carbon monoxide (CO) to nitrogen ($N_2$) of 1.0 was introduced to maintain the inside of the reactor at 1,650° C. for 24 hours.

Figure 11:
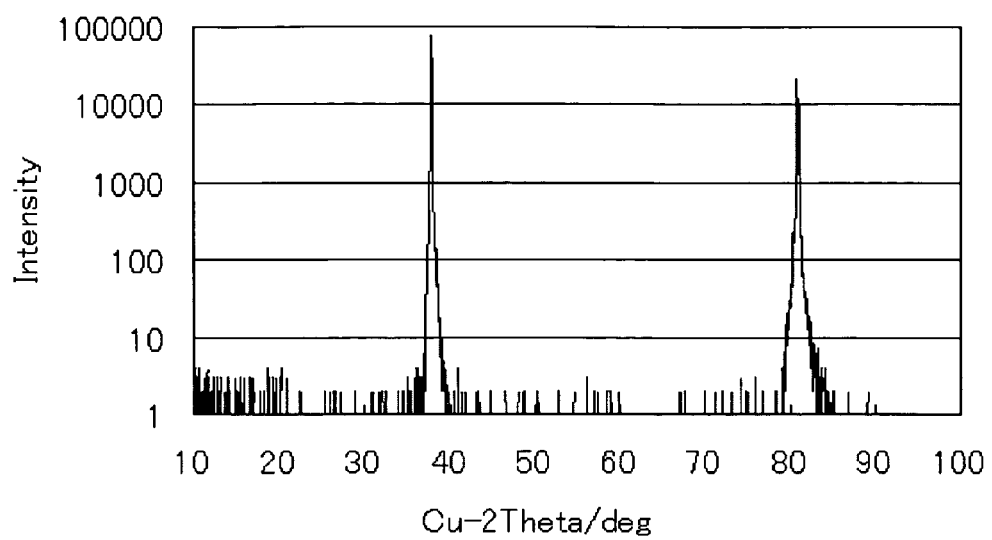
FIG. 11 is a graph showing the XRD (X-ray diffraction) profile of a sample obtained in Comparative Example 1.

An attempt was made on the X-ray diffraction analysis of the obtained sapphire substrate after the reaction to confirm the existence of alon and AlN but all of them were not detected as shown in FIG. 11.

Comparative Example 2

An attempt was made to form an AlN film and an alon layer by nitriding a sapphire substrate with an $N_2$—CO mixed gas and graphite at 1,720° C. in the reactor shown in FIG. 2. The details of the reactor were the same as in Example 1 and a mixed gas having a partial pressure ratio of carbon monoxide (CO) to nitrogen ($N_2$) of 0.1 was introduced to maintain the inside of the reactor at 1,720° C. for 24 hours.

Figure 12:
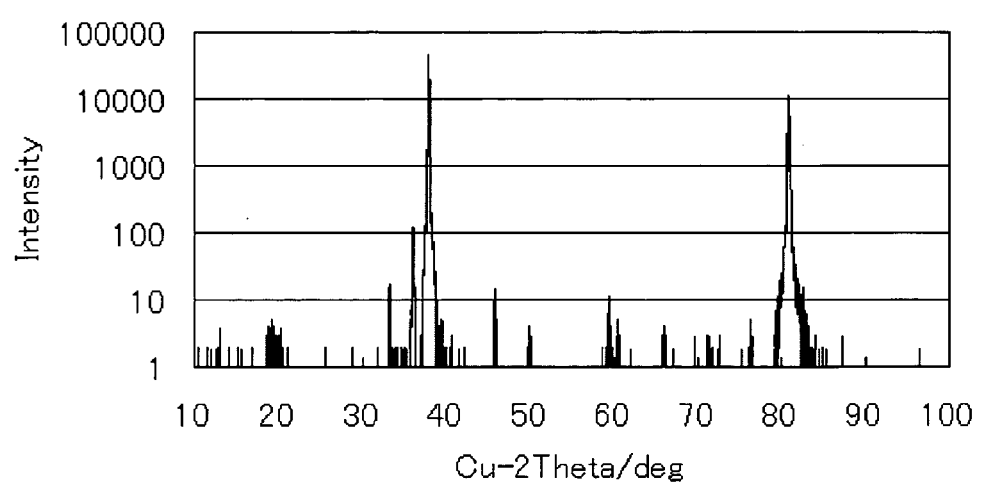
FIG. 12 is a graph showing the XRD (X-ray diffraction) profile of a sample obtained in Comparative Example 2.
Figure 13:
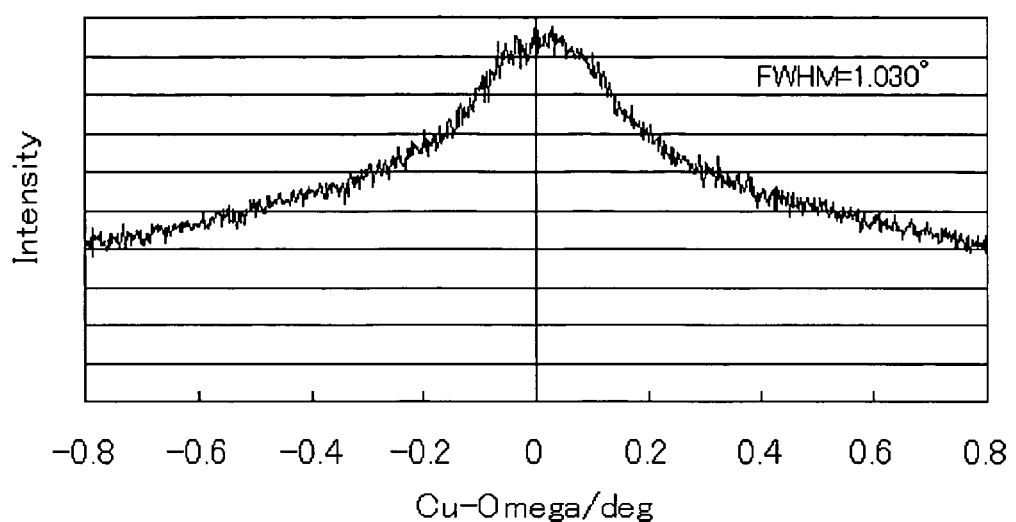
FIG. 13 is a graph showing the ω-mode rocking curve of an AlN film obtained in Comparative Example 2.

An attempt was made on the X-ray diffraction analysis of the obtained sapphire substrate after the reaction to confirm the existence of alon and AlN and the existence of both phases was confirmed as shown in FIG. 12. However, the surface roughness was extremely high and the half-value width of the rocking curve of the formed AlN was 3,708 arcsec as shown in FIG. 13.

What is claimed is:

1. A process for producing a highly crystalline aluminum nitride multi-layered substrate by nitriding a single-crystal α-alumina substrate in the presence of carbon, nitrogen and carbon monoxide to form a crystalline aluminum oxynitride layer and a highly crystalline aluminum nitride film as an outermost layer directly on the crystalline aluminum oxynitride layer, said highly crystalline aluminum nitride film as an outermost layer having a film surface smoothness in terms of Ra and RMS of 100 nm or less, wherein nitriding is carried out under reaction conditions which satisfy the following conditions a to d:

a: the equilibrium partial pressure of $Al_2O(g)$ in the reaction formula (1) is $5 \times 10^{-4}$ bar or less:

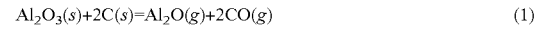

$$Al_2O_3(s)+2C(s)=Al_2O(g)+2CO(g) \qquad (1)$$

b: the equilibrium partial pressure of $Al_2O(g)$ in the reaction formula (2) is $5 \times 10^{-6}$ bar or less:

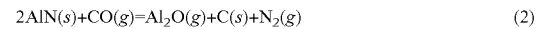

$$2AlN(s)+CO(g)=Al_2O(g)+C(s)+N_2(g) \qquad (2)$$

c: the reaction formula (3) proceeds to the right side:

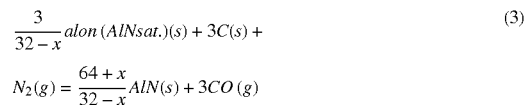

$$\frac{3}{32-x}alon(AlNsat.)(s) + 3C(s) + N_2(g) = \frac{64+x}{32-x}AlN(s) + 3CO(g) \qquad (3)$$

wherein alon (AlNsat.) means aluminum oxynitride which is saturated aluminum nitride, and d: the reaction temperature is 1,630° C. (1,903K) or higher and lower than 1,700° C. (1,973K).

2. The process according to claim 1, wherein the crystalline aluminum oxynitride layer has a threading dislocation density of $6.3 \times 10^7/cm^2$ or less and a crystal orientation expressed by the half value width of its rocking curve of 4,320 aresec or less.

3. The process according to claim 1, wherein the highly crystalline aluminum nitride film is the outermost layer and has a threading dislocation density of $6.3 \times 10^7/cm^2$ or less and a crystal orientation expressed by the half value width of its rocking curve of 600 arcsec or less.

* * * * *